United States Patent

Ayliffe et al.

[11] Patent Number: 5,933,707
[45] Date of Patent: Aug. 3, 1999

[54] CRYSTAL SUBSTRATE PROCESSING

[75] Inventors: Peter John Ayliffe, Stansted; James Wilson Parker, Bishop's Stortford; Paul Mark Harrison, Springfield; Robert George Peall, Harlow; Martin Christopher Geear, Bishop's Stortford; Roger William Harcourt, Dullingham, all of United Kingdom

[73] Assignee: Northern Telecom Limited, Montreal, Canada

[21] Appl. No.: 08/612,314

[22] Filed: Mar. 7, 1996

[30] Foreign Application Priority Data

Mar. 11, 1995 [GB] United Kingdom ............ 9505001

[51] Int. Cl.$^6$ .................................................. H01L 21/44
[52] U.S. Cl. ............................................. 438/107; 438/64
[58] Field of Search .................................... 438/107, 108, 438/109, 945, 64

[56] References Cited

U.S. PATENT DOCUMENTS 5,302,547  4/1994  Wojnarowski et al. .................. 438/945

FOREIGN PATENT DOCUMENTS 0 288 052  10/1988  European Pat. Off. .
0 305 112  3/1989   European Pat. Off. .
0 478 426  4/1992   European Pat. Off. .

OTHER PUBLICATIONS

Sudo, "A Silicon–Based Multichip Module with Co–Fired Aluminum Nitride Package", IEICE Transactions, vol. E74, No. 8, Aug. 1991, pp. 2323–2330.

*Primary Examiner*—Kevin M. Picardat
*Attorney, Agent, or Firm*—Lee, Mann, Smith, Mcwilliams, Sweeney & Ohlson

[57] ABSTRACT

This disclosure relates to the fabrication of components on a single crystal substrate. A method is disclosed of overcoming the problems encountered in defining etched features on a silicon substrate. In particular, there is disclosed a method of producing a multichip module comprising a silicon substrate having surface features for the placement of components. An organic dielectric is applied to the substrate prior to the use of an etchant whereby interconnects can be defined.

10 Claims, 5 Drawing Sheets

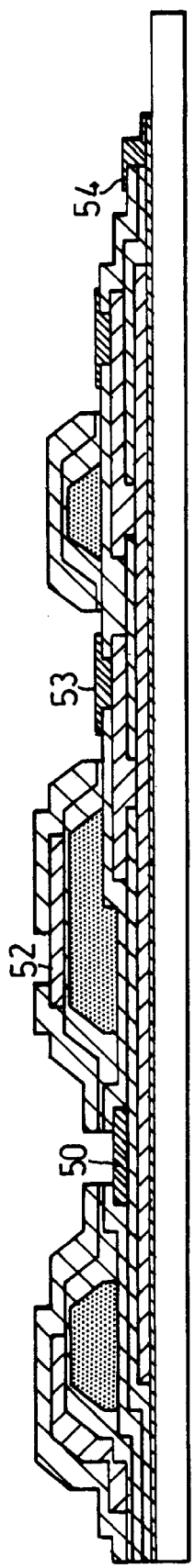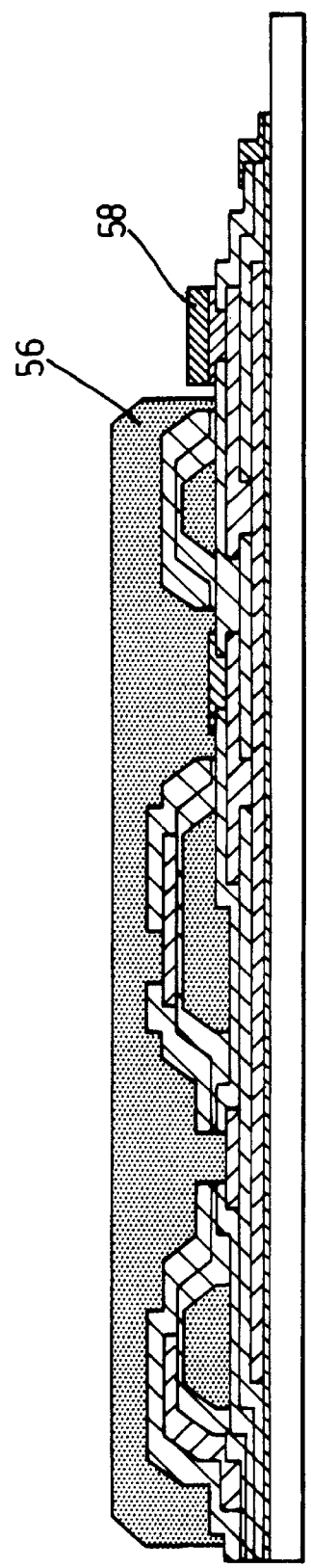

CRYSTAL SUBSTRATE PROCESSING

FIELD OF THE INVENTION

This invention relates to the fabrication of electro-optic components on a single crystal substrate and in particular to the precision machining of silicon by the use of etchants.

BACKGROUND ART

The precision machining of single crystal silicon and of layers deposited on such single crystal substrate is important for the production of many opto-electronic components. Typically during the processing of substrates, such as a multi-chip module substrates, precision machined features are required for applications such as the mounting of optical components, e.g. fibres, ball lenses or fabrication of sensors. On the substrate, electrical circuits are defined by the provision of both high and low impedance conducting patterns.

The optical component may be a ball lens mounted in an etched pit, or a graded index lens or an end of an optical fibre which is mounted in an etched groove. Further examples of an optical component that may be located in this way is an optical isolator or a planar waveguide component. One of the advantages of this form of location of an optical component is the dimensional stability it is likely to afford in relation to the electro-optic component and a further advantage is the precision of positioning it can afford.

One method of machining silicon is the crystallographic etching of a v-groove. A photolithographic process is used to define a mask in typically silicon nitride over the single crystal substrate. An anisotropic etch process may then be used to produce a v-groove in the substrate. Typically the processing of the substrate would begin with masking and anisotropic etching steps to form a pattern of v-grooves or pits across the substrate. After the etching, further processing is required to form a pattern for conductive circuits and component mounting sites. There are considerable advantages to machining the silicon at the end of the module fabrication process, which are principally due to the difficulty of accurately patterning subsequent layers when the substrate is no longer substantially flat. Considerable variations in photoresist thickness can occur due to the presence of such features leading to inaccurate patterning.

The presence of both high and low impedance electrical interconnects is often a requirement of such opto-electronic modules. High impedance interconnects conventionally require a considerable dielectric thickness. Although fabrication would be possible with inorganic dielectrics this is undesirable due to the problems associated with depositing and patterning these thick layers. In this respect we have employed an organic dielectric greatly simplifying the fabrication of the high impedance circuitry.

A final passivating layer of inorganic dielectric is required over the high impedance interconnect level and the organic dielectric. There is a difficulty which arises from the deposition and patterning of the high impedance interconnect and this passivating layer. That is the removal of unwanted metal and dielectric over the wettable pad layers, low impedance dielectric and any exposed silicon which would cause damage to these sensitive layers.

For the most part silicon etches are aggressive to most materials. Even for materials which are not readily attacked by etchants any exposed interfaces may prove to be an area of weakness. Such areas are frequently found when coating levels of appreciable topography with an inorganic dielectric. Such an area is the edge of the high impedance dielectric. An inorganic dielectric protection layer is used which can be patterned to selectively protect the substrate. After solder deposition and silicon etching this protection layer may be stripped in an oxygen based plasma without adversely affecting any other layers. This protection layer has the advantage of allowing the module to be completed without any further photolithographic stages after deposition of the solder or machining of the silicon.

The present invention is directed to an improved process for the definition of etched features on a silicon substrate.

SUMMARY OF THE INVENTION

According to the present invention there is provided a method of producing a multichip module comprising a silicon substrate having surface features for the placement of components wherein an organic dielectric is applied to the substrate prior to the use of an etchant whereby interconnects can be defined.

According to a second aspect of the present invention, there is provided a method of producing a multi-chip module substrate which employs an anisotropic silicon etchant in a processing stage to form precision machined features in the substrate wherein, prior to the use of said etchant, a masked layer of organic dielectric is applied to the substrate, which dielectric protects surface features previously defined. Preferably the etchant comprises a catechol, 1, 2 diaminoethane and water composition (EDP). Preferably the organic dielectric is a polyimide which fully imidizes (or cross links) on curing.

By etching the I/Os in the final passivation prior to the deposition of solder, the application of the organic dielectric protective layer and the etching of the v-grooves, the etchant is prevented from accessing the opened I/Os and the number and complexity of the patterning stages is thereby greatly reduced.

To overcome the problems which arise in patterning, the inorganic high impedance layer is patterned in such a way to cover these layers in the so called "optical area". The metal and inorganic dielectric may be removed over the organic dielectric in the optical area in the same processing steps that define the high impedance interconnect and vias to this interconnect. The organic dielectric can be simply removed from the optical area, for example, by an oxygen plasma without causing damage to any of the exposed layers.

Having opened vias to the high impedance interconnect these are then exposed to the silicon etch solution and protection of these areas is required. A metal layer of similar composition to the "wettable pad" layer would provide adequate protection. Similarly a layer of organic dielectric material (such as Pyralin LX2611D™) could be used to protect the exposed vias.

According to a further aspect of the invention, there is provided a multichip module substrate which possesses features in the substrate defined by an anisotropic silicon etchant wherein, surface features previously defined are masked by a protective layer of organic dielectric applied to the substrate prior to the use of said etchant.

DESCRIPTION OF THE DRAWINGS

In order that the invention may be more fully understood, reference will now be made to the figures of the drawing sheets wherein;

FIGS. 2a to 2g show processing steps in the manufacture of a typical substrate.

Referring to FIG. 1, there is shown a module 10 in single crystal silicon having a number of passive components including resistors and capacitors, high and low impedance interconnects and a number of active components such as semiconductor lasers, back-facet monitors and driver ICs. The module is based on a silicon substrate and fabrication of this substrate will now be discussed.

Referring to FIG. 2a, there is shown a portion of a (100) orientated silicon substrate 20, having a (110) primary flat. Preferably the substrate has a major flat cut to a tolerance within ±0.5° to facilitate the etching of v-grooves by enabling good control over the dimensions of the v-grooves. Layer 22 comprises a silicon nitride layer which can be deposited by CVD or PECVD techniques, and is typically 2000Å thick. This layer electrically isolates the silicon from the conductive layers and this will later form the mask aperture which defines the v-grooves. The ground plane interconnect layer 24 consists of aluminium film which is subsequently deposited, for example, by E-beam evaporation at room temperature to a thickness of typically about 3 μm. This ground plane can then be patterned using photolithographic and etch processes. A low impedance dielectric layer 26 is then deposited to a thickness of 3 μm by, for example, PECVD. Reactive ion etching (RIE) is then employed to form vias 28, 30 into this dielectric 26. An aluminium low impedance interconnect layer 32 is then deposited upon the substrate by, for example, an evaporation process. This layer is then patterned by etching to enable low impedance lines to be produced.

With reference to FIG. 2b, a second dielectric 34 is then deposited to a thickness of, for example, 1.5 μm. This dielectric serves to prevent electrical shorts occurring between the interconnect layer 32 and subsequent metallisations e.g. solder pads 36. This layer also protects the interconnect from attack during later silicon micromachining stages. Vias 37 are etched into this dielectric and openings 38 are etched down to the nitride isolation layer where the etching of the silicon will be required. The openings in the v-groove area are wet etched in a buffered hydrofluoric acid etchant which is selective to silicon nitride. It is important that a silicon nitride layer remains over the silicon in these regions as it is this layer which defines the v-grooves.

A multi-layer metallisation, referred to as the "wettable pad", is deposited next by evaporation and patterned by lift-off. This layer comprises an adhesion layer, typically titanium or chrome, and a solder wettable layer, typically platinum/gold, palladium/gold or nickel/gold. This metallisation has two functions: that of forming a bond pad for the laser and other optoelectronic components and; that of serving as a mask to define the position and dimensions of a v-groove in the previously defined openings 38. By depositing the metallisation in one masking layer, self-alignment of the wettable pad in relation to the v-groove is thereby achieved. Deposition and patterning of this metallisation is typically achieved by an E-beam evaporation and lift-off process. The v-groove mask is conveniently formed in the nitride isolation layer by using RIE (FIG. 2c) where the wettable pad may be used to define critical edges. A resist mask may be used to coarsely define some v-groove edges and prevent other areas of the module from being etched.

Figure 1:
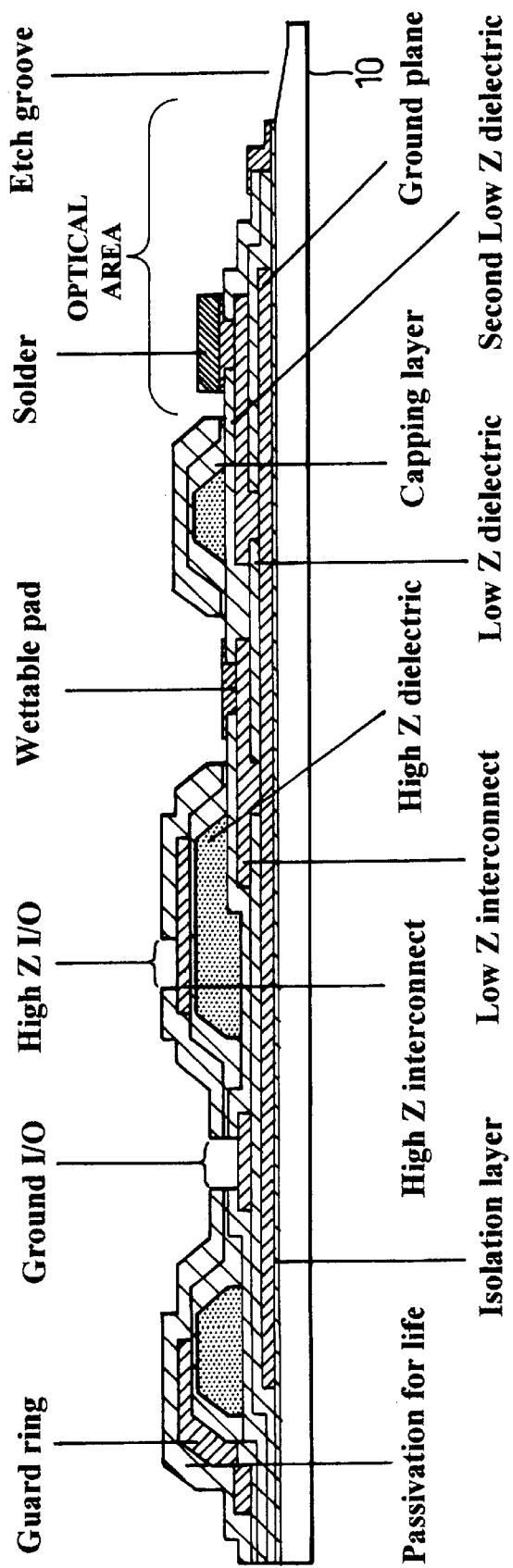
FIG. 1 shows a cross section through a silicon substrate transmitter module.
Figure 2A:
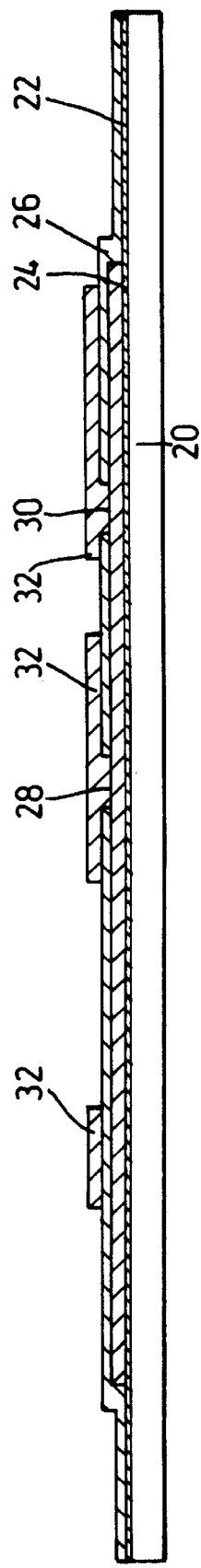
Figure 2B:
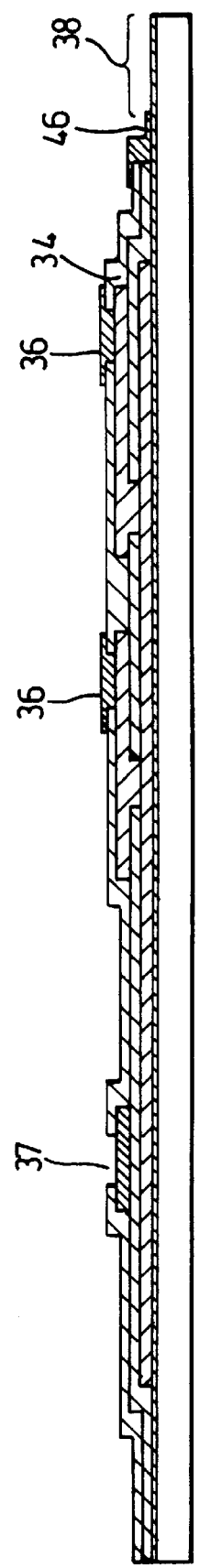
Figure 2C:
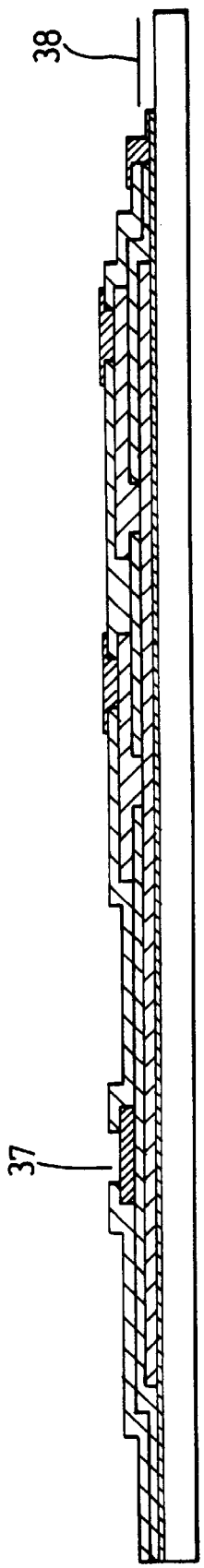
Figure 2D:
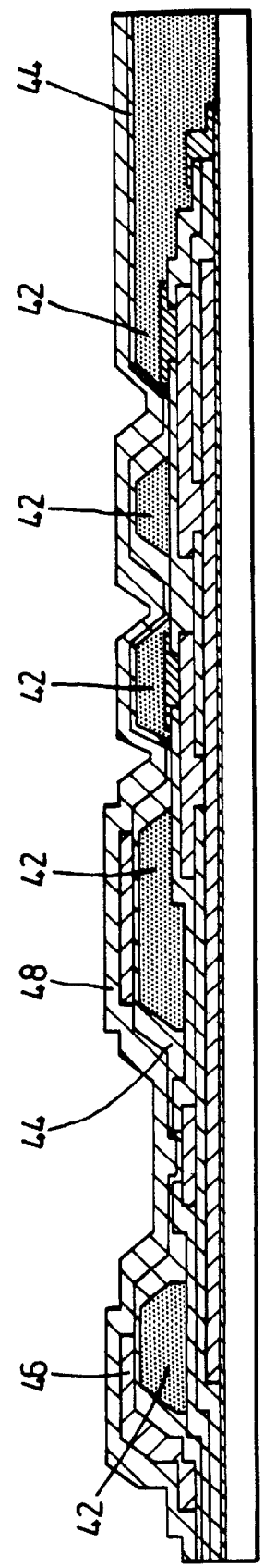

Referring now to FIG. 2d, a further dielectric layer 42 is applied so that high impedance interconnect lines (~50Ω) may be fabricated. This further dielectric consists of a low expansion coefficient material such as Pyralin LX2611D™, which is applied by conventional spinning and curing techniques. The thickness of this layer is typically 15 μm to achieve the required impedances. An organic dielectric was chosen due to ease of achieving the required thickness and ease of patterning such a thick layer. Patterning is by photolithographic and etch techniques. The profile of the organic dielectric can be tailored to enable good coverage of subsequent metal or dielectric layers. This layer is patterned to leave areas containing the wettable pad 53 and exposed silicon 54 (the "optical areas") covered with the organic dielectric—see FIG. 2e. This enables dielectric and metal layers deposited later to be removed more easily.

A layer of dielectric 44, typically $SiO_2$ or silicon nitride, is deposited by PECVD over the substrate. This improves the adhesion of the high impedance interconnect layer to the polyimide and facilitates wire bonding to this interconnect and provides an etch stop to exposed aluminium on the low impedance interconnect.

The high impedance and other circuitry 46 is formed from aluminium by an evaporation process, for example, to a thickness of 3 μm. This layer is then imaged by a photolithographic and plasma etch process. The resist can be applied with sufficient thickness to ensure continuity of the aluminium over the rounded edges. Afterwards, the resist was removed with an oxygen plasma and a wash such as Posistrip™.

Passivation layers denoted 48 in FIG. 2d of 2 μm $SiO_2$ and 0.5 μm $Si_3N_4$ are then sequentially deposited by PECVD to provide lifetime protection to areas of the module not passivated by layers 34 or 36. A slow rate of deposition is preferable to ensure uniformity. Input/output portions 50–54 are then opened up photolithographically using a plasma etch process. It should be ensured that no etching of the passivation over the edges of topographical features occurs in this process. The resist used in this photolithographic process must be applied in such a way so as to ensure proper coverage. If passivation thinning occurs, it can provide a weakness through which a subsequent EDP etch can penetrate. During the etch of the final passivation layer, the etch can also open up the protected optical areas 53, 54 (see FIG. 2e) under which lie the electrical circuitry and sites for mounting the optical circuitry which had both been protected by the organic dielectric 42. This organic dielectric can then be removed by a plasma etch. The wettable pad should not be attacked or sputtered in order to avoid the possibility of causing short circuits.

Referring now to FIG. 2f a single layer of an organic dielectric 56 is applied by spinning and opened by pseudo photo-imaging to expose the optical area 54. A solder layer can either be evaporated through a stencil onto the optoelectronic bond pads or a thick bilayer process can be used for lift-off patterning of solder. The solder is preferably of a 80/20 eutectic AuSn composition and as such does not require the use of a flux when bonding components.

Figure 2G:
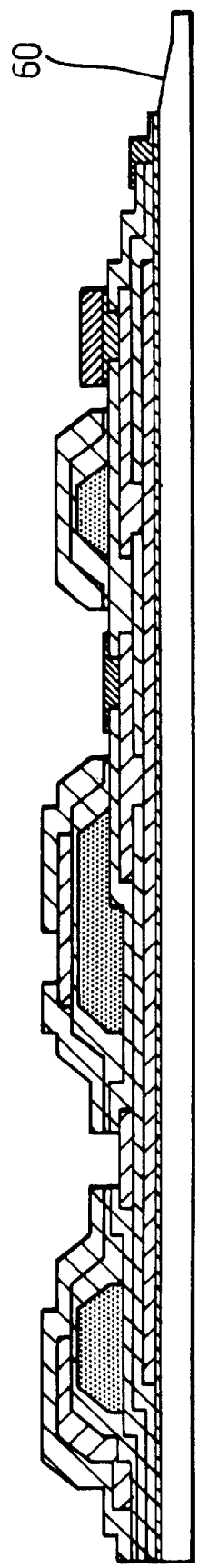

Silicon etching to form v-grooves 60, FIG. 2g can be achieved by using an anisotropic aqueous solution which may be based on a catechol, 1, 2-diaminoethane composition. Etching is performed on a timed basis or until the required dimensions are achieved. The use of such an anisotropic etchant enables tight control over the important lateral dimensions of the etched v-grooves and pits. After this etching, the final step in the wafer is the removal of the organic dielectric layer. A pure oxygen plasma has been found to give satisfactory results. A low power is required to be compatible with the exposed layers on the substrate. No further patterning is required as the vias 52 to the high impedance interconnect have previously been opened. This is of great advantage as photolithographic patterning is difficult once the v-grooves have been etched, due to the presence of deep features over the substrate.

Prior to the sawing into individual modules, the wafer can be protected with a spun layer of photoresist which can easily be removed with a solvent such as acetone and IPA. The substrates then have components attached and are packaged as appropriate.

We claim:

1. A method of producing a multichip module comprising a silicon substrate having a surface features for the placement of optical components wherein an organic dielectric is applied to the substrate prior to the use of an etchant, which dielectric protects surface features previously defined, whereby interconnects can be defined.

2. A method according to claim 1, wherein the etchant comprises a catechol, 1,2 diaminoethane and water composition (EDP).

3. A method according to claim 1 wherein the dielectric is a polyimide which fully imidizes on curing.

4. A multichip module as produced according to the method of claim 1.

5. A method of producing a multi-chip module substrate which employs an anisotropic silicon etchant in a processing stage to form precision machined features in the substrate wherein, prior to the use of said etchant, a masked layer of organic dielectric is applied to the substrate, which dielectric protects surface features previously defined.

6. A method according to claim 5 wherein the dielectric is a polyimide which fully imidizes on curing.

7. A method according to claim 2 wherein the dielectric is a lolyimide which fully imidizes on curing.

8. A method according to claim 5, wherein the etchant comprises a catechol, 1,2 diaminoethane and water composition (EDP).

9. A method according to claim 8 wherein the dielectric is a polyimide which fully imidizes on curing.

10. A multi-chip module substrate which possesses features in the substrate defined by an anisotropic silicon etchant wherein, surface features previously defined are masked by a protective layer of organic dielectric applied to the substrate prior to the use of said etchant.

* * * * *